(12) United States Patent
Van Dongen et al.

(10) Patent No.: US 10,317,482 B2
(45) Date of Patent: Jun. 11, 2019

(54) RESISTIVE SENSOR FRONTEND SYSTEM HAVING A RESISTIVE SENSOR CIRCUIT WITH AN OFFSET VOLTAGE SOURCE

(71) Applicant: NXP B.V., Eindhoven (NL)

(72) Inventors: Marijn Nicolaas Van Dongen, Eindhoven (NL); Edwin Schapendonk, Oss (NL); Selcuk Ersoy, Eindhoven (NL)

(73) Assignee: NXP B.V., Eindhoven (NL)

( * ) Notice: Subject to any disclaimer, the term of this patent is extended or adjusted under 35 U.S.C. 154(b) by 30 days.

(21) Appl. No.: 15/356,561

(22) Filed: Nov. 19, 2016

(65) Prior Publication Data
US 2018/0143270 A1    May 24, 2018

(51) Int. Cl.
*G01R 33/09* (2006.01)
*H03M 3/00* (2006.01)

(52) U.S. Cl.
CPC .......... *G01R 33/096* (2013.01); *H03M 3/422* (2013.01); *H03M 3/462* (2013.01); *H03M 3/464* (2013.01)

(58) Field of Classification Search
USPC ....................................................... 324/252
See application file for complete search history.

(56) References Cited

U.S. PATENT DOCUMENTS

| 5,227,795 | A | 7/1993 | Yamakido et al. | |
|---|---|---|---|---|
| 5,471,209 | A * | 11/1995 | Sutterlin | H03M 3/39 |
| | | | | 341/143 |
| 6,642,873 | B1 * | 11/2003 | Kuang | H03M 3/424 |
| | | | | 341/143 |
| 2004/0100289 | A1 | 5/2004 | Lull | |
| 2006/0052967 | A1 | 3/2006 | Champion et al. | |
| 2007/0139241 | A1 | 6/2007 | Hales et al. | |
| 2013/0060498 | A1 | 3/2013 | Lokken et al. | |

(Continued)

FOREIGN PATENT DOCUMENTS

EP    2955492 A1    5/2017

OTHER PUBLICATIONS

Mohan, N. et al., "A Novel Dual-Slope Resistance-to-Digital Converter", IEEE Transactions on Instrumentation and Measurement, vol. 59, No. 5, May 2010, pp. 1013-1018.

(Continued)

*Primary Examiner* — Jay Patidar
(74) *Attorney, Agent, or Firm* — Daniel D. Hill

(57) ABSTRACT

A resistive sensor includes a current input sigma-delta converter that uses a switched offset voltage source to provide scalable gain and more linear operation. The sigma-delta converter includes an integrator, a quantizer, and a decimator. In one embodiment, the resistive sensor and offset voltage source are coupled to provide an input current at a first node. The integrator has a first input terminal coupled to the first node, and an output terminal. The quantizer has a first input terminal coupled to the output terminal of the integrator, a second input terminal for receiving a clock signal, and an output terminal coupled to provide a feedback signal to control the offset voltage source. The decimator has an input terminal coupled to the output terminal of the quantizer, and an output terminal for providing an output signal. The switched offset voltage source provides scalable gain and good linearity.

16 Claims, 8 Drawing Sheets

(56) References Cited

U.S. PATENT DOCUMENTS

2016/0341800 A1* 11/2016 Schapendonk .... G01R 33/0023

OTHER PUBLICATIONS

Mohan, N. et al., "Analysis of a Sigma—Delta Resistance-to-Digital Converter for Differential Resistive Sensors", IEEE Transactions on Instrumentation and Measurement, vol. 58, No. 5, May 2009, pp. 1617-1622.
Nagarajan, P. et al., "An Improved Direct Digital Converter for Bridge-Connected Resistive Sensors", IEEE Sensors Journal, vol. 16, No. 10, May 15, 2016, pp. 3679-3688.
Kumar, V. J., et al.; "Digital Converter for Push-Pull Type Resistive Transducers" IEEE Instrumentation and Measurement Technology Conference Proceedings, May 16-19, 2005 in Ottawa, Ontario, Canada; pp. 422-425; DOI: 10.1109/IMTC.2005.1604150.
Sreenath, Vijayakumar, et al.; "A Resistance-to-Digital Converter Possessing Exceptional Insensitivity to Circuit Parameters;" IEEE International Instrumentation and Measurement Technology Conference Proceedings (I2MTC); May 23-26, 2016 in Taipei, Taiwan; DOI: 10.1109/I2MTC.2016.7520349.

* cited by examiner

RESISTIVE SENSOR FRONTEND SYSTEM HAVING A RESISTIVE SENSOR CIRCUIT WITH AN OFFSET VOLTAGE SOURCE

BACKGROUND

Field

This disclosure relates generally to sensors, and more specifically, to a resistive sensor frontend system having a sigma-delta analog-to-digital converter.

Related Art

Resistive sensors are often used to measure quantities like displacement, pressure and magnetic field strength. One type of resistive sensor uses anisotropic magnetoresistance (AMR) to measure magnetic field strength and/or direction. Anisotropic magnetoresistance sensors are sensitive to both the direction and the strength of the magnetic field. Depending on the application, either the strength or the direction sensitivity (or both) are used. For example, in angular sensors, only the direction sensitivity of the AMR is used. Many systems use sigma-delta analog-to-digital converters to create a high-resolution digital representation of a measurand, for example, a magnetic field. Since most ADCs are provided with a voltage at the input, typically a bridge structure is used to convert the resistance into a voltage. One of the potential drawbacks of a voltage input system is the voltage range requirements at the input of the SD-ADC, especially if single-bit feedback is used in the SD-ADC. Depending on the implementation of the input stage, significant resources may be needed to insure the transfer function is sufficiently linear.

An alternative approach to using a voltage input is to use a current input. A current input allows an input voltage range to be smaller, which can relax some requirements for the input stage. However, since the current through the resistive sensor varies inversely proportionally to the resistor value, it is not trivial to obtain a linear system transfer function if the measurand is proportional to the resistor value.

A resistive sensor structure that can provide a linear transfer function has been called a direct digital converter for resistive sensors (DDC) or a resistance-to-digital converter (RDC). The RDC switches currents obtained from the resistive sensors such that a linear transfer is obtained when all components are considered ideal. However, this structure has some problems. For example, the transfer gain of an RDC system is fixed at y=0.5+0.5x, where x is the relative change in resistance and y is the output. The resistance of the resistive sensor is $R_{SENSOR}=(1\pm x)*R$. When there is a situation in which x is limited to a few percent (e.g. in an AMR sensor), the output will also have a very small amplitude. In addition, the system linearity is sensitive to mismatch in the reference voltages. When these are not matched well, the transfer becomes non-linear. Accurate matching of voltage references can take significant resources. Also, the current through the sense resistors is a pulsating current. For magnetic sensors, such as AMR, this might be problematic due to the change in magnetic field that is associated with the pulsating current. Furthermore, the input current range for the integrator of the sigma-delta converter is large. Depending on the value of the resistive sensors, a relatively large integrator capacitor is required in order to limit the output swing of the integrator. This capacitor might take up significant space in an integrated circuit. Therefore, there exists a need for a better current input sigma-delta converter for resistive sensors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
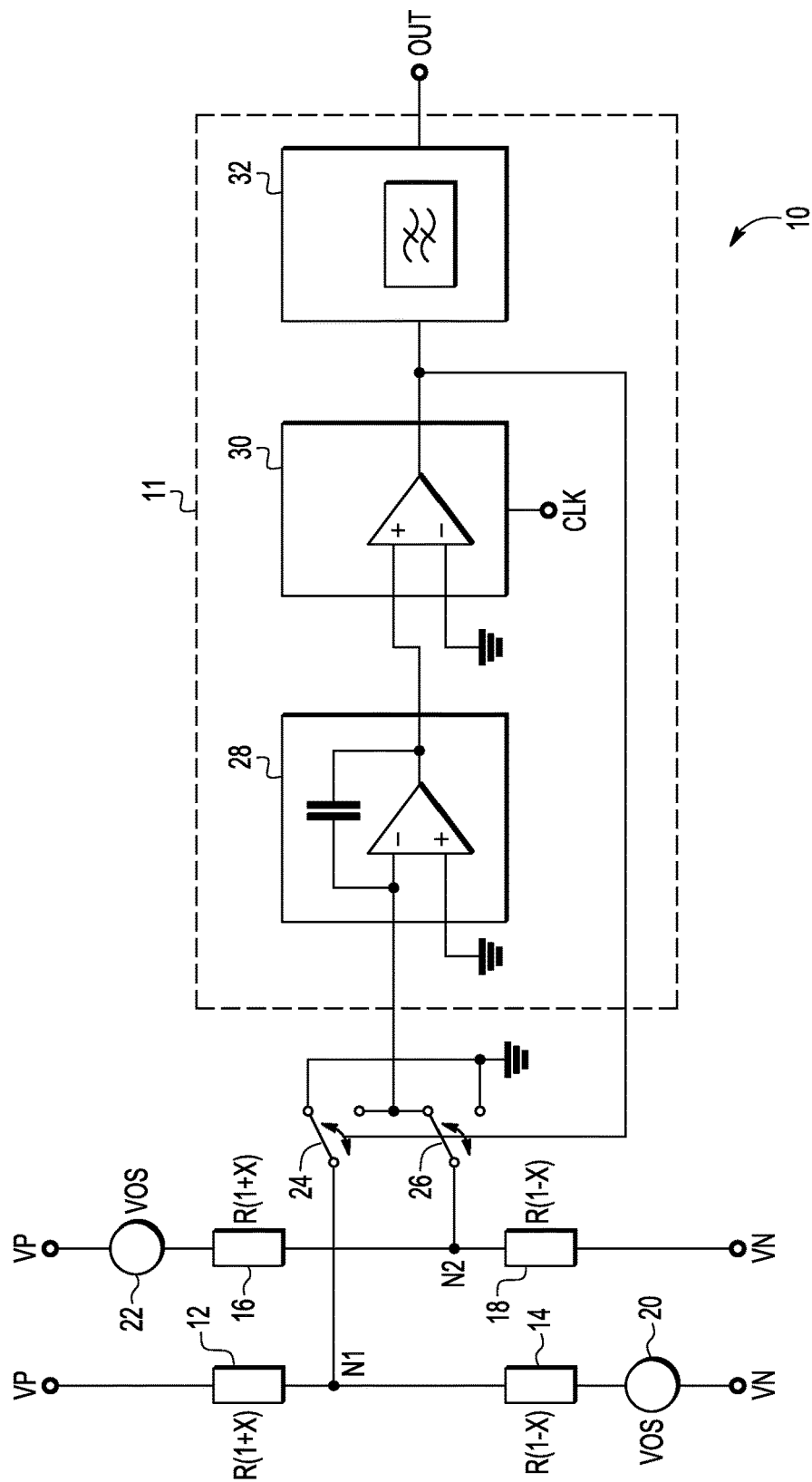
FIG. 1 illustrates a diagram of a resistive sensor frontend system in accordance with an embodiment.

Generally, there is provided, a resistive sensor frontend system comprising a current input sigma-delta converter that uses a switched offset voltage to tune the gain and to improve the robustness against non-linearity due to mismatch. In one embodiment, the resistive sensor and offset voltage source are coupled to provide an input current at a first node. The first node is connected to an input of an integrator. An output of the integrator is connected to an input of a quantizer. The quantizer as a second input for receiving a clock signal, and an output terminal coupled to provide a feedback signal to control the offset voltage source. A decimator has an input connected to the output terminal of the quantizer, and an output terminal for providing an output signal. Multiple embodiments provide both scalable gain and good linearity.

In one embodiment, there is provided, a resistive sensor frontend system comprising: a resistive sensor circuit and offset voltage source coupled to provide an input current at a first node; an integrator having a first input terminal coupled to the first node, and an output terminal; a quantizer having a first input terminal coupled to the output terminal of the integrator, a second input terminal for receiving a clock signal, and an output terminal coupled to provide a feedback signal to control the offset voltage source; and a decimator having an input terminal coupled to the output terminal of the quantizer, and an output terminal for providing an output signal. The resistive sensor may comprise at least one anisotropic magnetoresistance sensor. The offset voltage source may further comprise a resistive sensor element in parallel with a switch, the feedback signal from the output terminal of the quantizer being used to control the switch. The resistive sensor circuit and offset voltage source may comprise: a first resistive sensor element having a first sensitivity direction, the first resistive sensor element having a first terminal and a second terminal; a second resistive sensor element having a second sensitivity direction opposite the first sensitivity direction, the second resistive sensor element having a first terminal coupled to the second terminal of first resistive sensor element at the first node, and a second terminal; a first switched offset voltage coupled between the first terminal of the first resistive sensor element and a first source voltage; and a second switched offset voltage coupled between the second terminal of the second resistive sensor element and a second source voltage. The first source voltage may be a positive voltage and the second source voltage is a negative voltage. The resistive sensor frontend system may be fully differential. The resistive sensor frontend system may further comprise a higher order sigma-delta converter. The resistive sensor circuit and offset voltage source may comprise: a first resistive sensor element having a first sensitivity direction, the first resistive sensor element having a first terminal coupled to a first voltage source, and a second terminal coupled to the first node; a second resistive sensor element having a second sensitivity direction, the second resistive sensor element having a first terminal coupled to the second terminal of the first resistive sensor element at the first node, and a second terminal; a first offset voltage source having a first terminal coupled to the second terminal of the second resistive sensor element, and a second terminal coupled to a second voltage source; a first switch having a first terminal coupled to the first node, the first switch coupling the first node to either the first input terminal of the integrator or to a voltage reference in response to the feedback signal; a second offset voltage source having a first terminal coupled to the first voltage source, and a second terminal; a third resistive sensor element having the first sensitivity direction, the third resistive sensor element having a first terminal coupled to the second terminal of the second offset voltage source, and a second terminal coupled to a second node; a fourth resistive sensor element having the second sensitivity direction, the fourth resistive sensor element having a first terminal coupled to the second terminal of the third resistive sensor element at the second node, and a second terminal coupled to the second voltage source; and a second switch having a first terminal coupled to the second node, the second switch coupling the first node to either the first input node of the integrator or to the voltage reference in response to the feedback signal. The resistive sensor circuit and offset voltage source may comprise: a first resistive sensor element having a first sensitivity direction, the first resistive sensor element having a first terminal coupled to a first voltage source, and a second terminal coupled to the first node; a second resistive sensor element having a second sensitivity direction, the second resistive sensor element having a first terminal coupled to the second terminal of the first resistive sensor element at the first node, and a second terminal coupled to a second voltage source; and first and second offset voltage sources having opposite polarities from each other, the first and second offset voltage sources alternately switched to a second input terminal of the integrator in response to the feedback signal.

In another embodiment, there is provided, a resistive sensor frontend system comprising: a first resistive divider comprising first and second resistive sensor elements of opposite sensitivity directions, the first resistive divider coupled between first and second voltage sources, the first and second resistive sensor elements coupled together at a first node; an offset voltage source coupled to the first resistive divider to provide an offset voltage in response to a feedback signal; an integrator having a first input terminal coupled to the first node, and an output terminal; a quantizer having a first input terminal coupled to the output terminal of the integrator, a second input terminal for receiving a clock signal, and an output terminal coupled to provide the feedback signal; and a decimator having an input terminal coupled to the output terminal of the quantizer, and an output terminal for providing an output signal. The offset voltage source may further comprise: a first switched offset voltage circuit coupled between the first resistive sense element and the first voltage source; and a second switched offset voltage circuit coupled between the second resistive sense element and the second voltage source, wherein the first and second switched offset voltage circuits are alternately switched in response to the feedback signal. The resistive sensor front end may comprise a higher order sigma-delta converter. The resistive sensor front end system may be fully differential. Each of the first and second switched offset voltage circuits may further comprise a resistive sensor element in parallel with a switch, the feedback signal from the output terminal of the quantizer being used to control the switch. The resistive sensor frontend system may further comprise: a second resistive divider comprising third and fourth resistive sensor elements of opposite sensitivity directions, the third and fourth resistive sensor elements coupled together at a second node; a switching circuit coupled between the first and second nodes and the first input terminal of integrator, the switching circuit for alternately coupling the first and second nodes to the first input terminal of the integrator in response to the feedback signal; wherein the offset voltage source for providing an offset voltage for each first and second resistive dividers. The offset voltage source may further comprise first and second offset voltage sources having opposite voltage polarities from each other, the first and second offset voltage sources alternately switched to a second input terminal of the integrator in response to the feedback signal. The first and second offset voltage sources may be coupled in series between the first and second voltage sources, each of the first and second offset voltage sources may further comprise a resistor in parallel with a switch, the switch responsive to the feedback signal. The first source voltage may be a positive voltage and the second source voltage may be a negative voltage. The first and second resistive sensor elements may be anisotropic magnetoresistance sensors. The resistive sensor may be implemented on a single integrated circuit.

FIG. 1 illustrates a diagram of a resistive sensor frontend system 10 in accordance with an embodiment. Resistive sensor frontend system 10 includes resistive sensor elements 12, 14, 16, and 18, offset voltage sources 20 and 22, switches 24 and 26, and a sigma-delta converter portion 11. Converter portion 11 includes integrator 28, quantizer 30, and decimator 32. Additional signal processing circuits (not shown) would be coupled to the output of decimator 32. The additional signal processing circuits may include post-processing such as offset correction or fault detection, or to calculate the quantity of interest (e.g. speed or angle) based on the output of multiple frontends.

Resistive sensor element 12 has a first terminal connected to a first voltage source labeled VP, and a second terminal connected to a node N1. Resistive sensor element 14 has a first terminal connected to the second terminal of resistive sensor element 12 at node N1, and a second terminal. Offset voltage source 20, provides an offset voltage labeled VOS, has a first terminal connected to the second terminal of resistive sensor element 14, and a second terminal connected to a second voltage source labeled VN. Voltage source VP is a positive voltage and voltage source VN is a negative voltage. Voltage sources VP and VN have the same magnitude in the illustrated embodiments. Voltage sources VP and VN can be different in other embodiments. Offset voltage source 22 also provides an offset voltage labeled VOS and has a first terminal connected to voltage source VP, and a second terminal. Resistive sensor element 16 has a first terminal connected to the second terminal of offset voltage source 22, and a second terminal connected to node N2. Resistive sensor element 18 has a first terminal connected to the second terminal of resistive sensor element 16, and a second terminal connected to second voltage source VN. Switch 24 has a first terminal connected to node N1, and a second terminal switchable between a reference voltage terminal, e.g. ground, and a first input terminal of integrator 28 in response to a feedback signal from an output terminal of quantizer 30. Switch 26 has a first terminal connected to node N2, and a second terminal switchable between the ground terminal and the first input terminal of integrator 28 in response to the feedback signal from the output terminal of quantizer 30. Integrator 28 has a first input terminal connected to switches 24 and 26, a second input terminal connected to a ground terminal, and an output terminal. Quantizer 30 has a first input terminal connected to the output terminal of integrator 28, a second input terminal connected to ground, and an output terminal. The output terminal of quantizer 30 provides the feedback signal for controlling switches 24 and 26. Decimator 32 has an input terminal connected to the output terminal of quantizer 30, and an output terminal for providing an output signal OUT.

In one embodiment, resistive sensor elements 12, 14, 16, and 18 are magnetic sensors that provide a changing resistance in response to a changing magnetic field. One type of resistive sensor is known as an anisotropic magnetoresistance sensor (AMR). Resistive sensor elements 12 and 16 each provide a resistance R that changes in a first sensitivity direction where the sensor resistance equals R(1+x), where x is a relative change in resistance. Likewise, resistive sensor elements 14 and 18 each provide a sensor resistance that changes in a second sensitivity direction, where the sensor resistance equals R(1−x).

In operation, resistive sensor elements 12 and 14 provide a current at node N1 that is inversely proportional to the measurand being sensed, for example, a magnetic field. Resistive sensor elements 12 and 14 react to the measurand in opposite directions. That is, resistive sensor element 12 may increase resistance in an increasing magnetic field while resistive sensor element 14 may decrease resistance in the increasing magnetic field. Also, resistive sensor elements 16 and 18 react similarly. Quantizer 30 provides a digital output and is clocked by a clock signal CLK. When the output of quantizer 30 is a logic low, the switches are positioned as illustrated, with switch 24 connecting node N1 to ground and switch 26 connecting node N2 to the first input terminal of integrator 28. When the output of quantizer 30 is a logic high, switch 24 connects node N1 to the first input terminal of integrator 28, and switch 26 connected node N2 to ground. The switches can change each clock cycle of clock signal CLK if the output of quantizer 30 changes. Offset voltages 20 and 22 provide a way to scale the gain of resistive sensor frontend system 10. Because clock signal CLK is over-sampled, decimator 32 is provided to down-sample the output of quantizer 30 to provide an output OUT at the system clock frequency.

The embodiment illustrated in FIG. 1 can be described in the following equation.

$$\alpha[V_P/R(1+x)-(V_N-V_{OS})/R(1-x)]=-(1-\alpha)[(V_P-V_{OS})/R(1+x)-V_N/R(1-x)]$$

$$\alpha=(V_N-V_P+V_{OS}+(V_N+V_P-V_{OS})x)/(2V_{OS})$$

Assuming $V_P=V_N=V$, we get the following:

$$\alpha=0.5+[(V-0.5V_{OS})/V_{OS}]x$$

where $\alpha$ is the pulse density. From this equation it can be seen that the gain of the transfer can be scaled by choosing a favorable combination of V and $V_{OS}$. The input currents are set by the difference of the current through both resistive divider sensors. This difference is determined by the offset voltage and the values of x.

Note that when $V_{OS}=0$ the values for $\alpha\rightarrow\infty$. Therefore, an offset voltage is required for the sigma-delta converter 10 to work properly. When $V_{OS}=0$ the input current for integrator 28 is equal during both phases, which means the output of integrator 28 continues to rise or fall, depending on x. For the system to work properly, the direction of the current into the integrator needs to change polarity when quantizer 30 switches. Inverting the magnetic polarity of one of the branches does not solve this problem. In this case the current into integrator 28 is inverted, but it is always equal, regardless of the value of x, which means that it always holds that $\alpha=0.5$.

Mismatch in the reference voltages $V_P=(1+\varepsilon)V$ and $V_N=V$ gives:

$\alpha=0.5-\varepsilon V/(2V_{OS})+((2-\varepsilon)V-V_{OS})/(2V_{OS})$ x, where $\varepsilon$ is the rate of mismatch of the offset voltage $V_{OS}$.

Mismatch in the reference voltage now introduces an offset and a change in the slope, but the transfer is still linear. The offset and slope could be compensated for in the digital post-processing.

Mismatch in the offset voltages $V_{OSP}=(1+\varepsilon)$ $V_{OS}$ and $V_{OSN}=V_{OS}$ gives:

$$\alpha=((1-\varepsilon)V_{OS}+[2V-(1+\varepsilon)V_{OS}]x)/(2V_{OS}+(1-x)\varepsilon V_{OS})$$

Mismatch in the offset voltage still introduces a non-linearity as well as an offset in the overall transfer.

If the resistive sensor elements are very sensitive, x may be in the range of about −1 to 1. In this case, offset voltage VOS, and thus an offset resistance, labeled ROS in FIG. 2, would need to be large. The converter will give a minimum output with x=−1 and a maximum output with x=1. On the other hand, if x has a smaller range, e.g. about −0.03 to 0.03 for AMR sensors, offset voltage VOS would need to be much smaller. Using this smaller value, the converter can be tuned to give a minimum output with x=−0.03 and a maximum output with x=0.03. Therefore, the value for VOS/ROS should be chosen to match the converter range with the resistive sensor range. The value for VOS/ROS should be chosen to match the converter range with the resistive sensor range.

Figure 2:
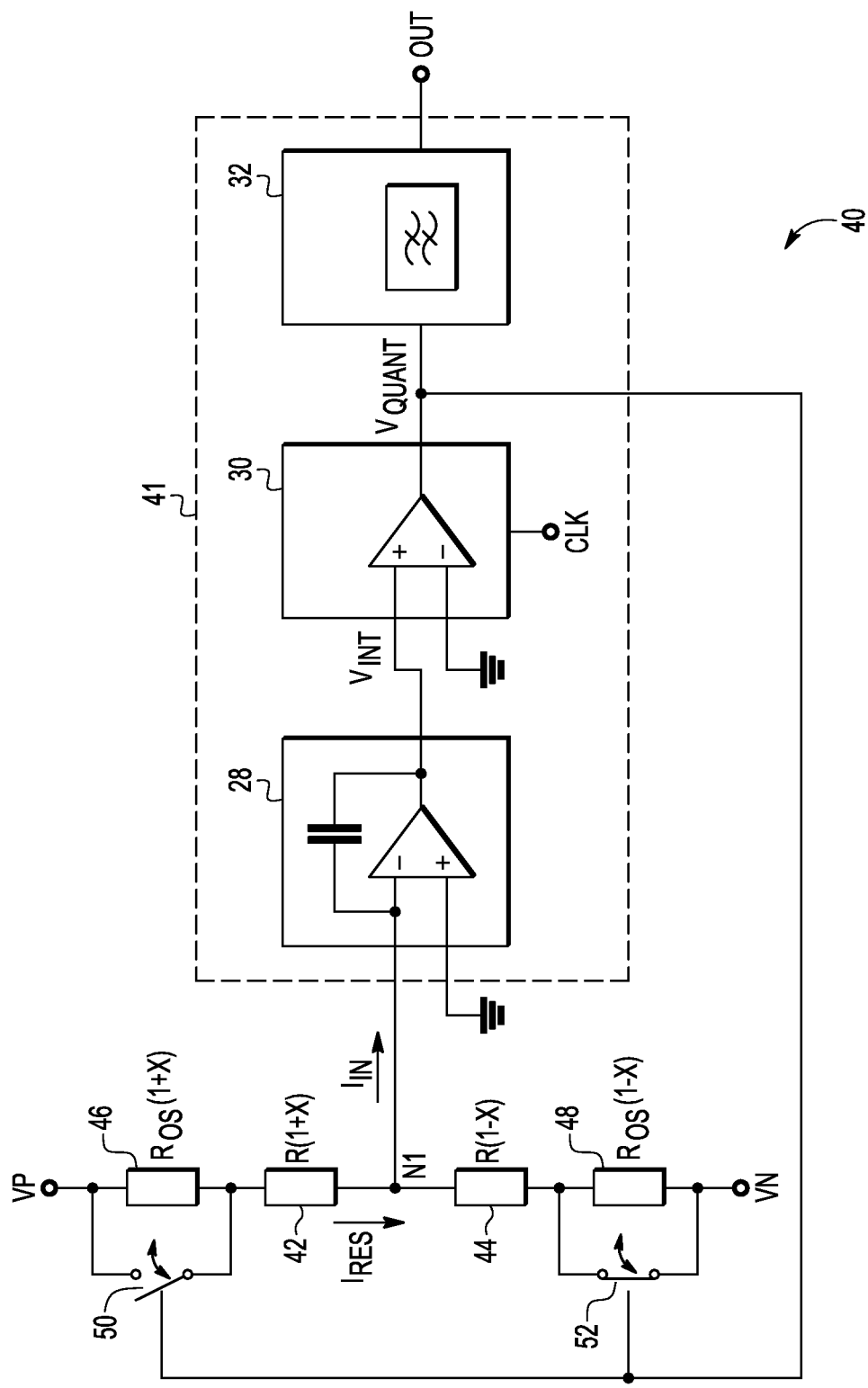
FIG. 2 illustrates a diagram of a resistive sensor frontend system in accordance with another embodiment.

FIG. 2 illustrates a diagram of resistive sensor frontend system 40 in accordance with another embodiment. Resistive sensor frontend system 40 includes resistive sensor elements 42 and 44, offset voltage sensor elements 46 and 48, switches 50 and 52, and a sigma-delta converter portion 41. Converter portion 41 includes integrator 28, quantizer 30, and decimator 32. Resistive sensor elements 42 and 44, and offset voltage sensor elements 46 and 48 may be AMR sensors. Resistive sensor 40 differs from resistive sensor 10 (FIG. 1) in that there is only one voltage divider providing an input to integrator 28. Offset sensor element 46 is coupled in parallel with switch 50 between voltage source VP and resistive sensor element 42 and provides a first offset voltage source for the resistive divider comprising resistive sensor elements 42 and 44. Offset sensor element 48 is coupled in parallel with switch 52 between voltage source VN and resistive element 44 and provides a second offset voltage source for resistive sensor elements 42 and 44. Resistive sensor element 42 and resistive sensor element 44 are coupled together at node N1 and provide a current labeled $I_{IN}$ to a first input terminal of integrator 28. Resistive sensor element 42 has a first sensitivity direction indicated by R(1+x), and resistive sensor element 44 has a second sensitivity direction indicated by R(1−x). Also, offset voltage sensor element 46 is the same material as resistive sensor element 42 and has the same sensitivity direction indicated by $R_{OS}$(1+x). Offset voltage sensor element 48 is the same as resistive sensor element 44 and has the same sensitivity direction given by $R_{OS}$(1−x). The value of an offset voltage provided by offset voltage sensor elements 46 and 48 is set by the ratio of $R_{OS}$ and R. Because the offset voltage elements 46 and 48 are formed from the same material as resistive sensor elements 42 and 44, the ratio determining the offset voltage remains constant for changing magnetic fields. Integrator 28, quantizer 30, and decimator 32 are substantially the same as illustrated in FIG. 1. An output of integrator 28 is labeled VINT, an output of quantizer 30 is labeled VQUANT. Switches 50 and 52 are controlled by a feedback voltage provided from the output VQUANT of quantizer 30. When the output VQUANT is a logic high or "1", switch 50 is open and switch 52 is closed, as illustrated in FIG. 2. When the output VQUANT is a logic low, or "0", the switch states are reversed.

Figure 3:
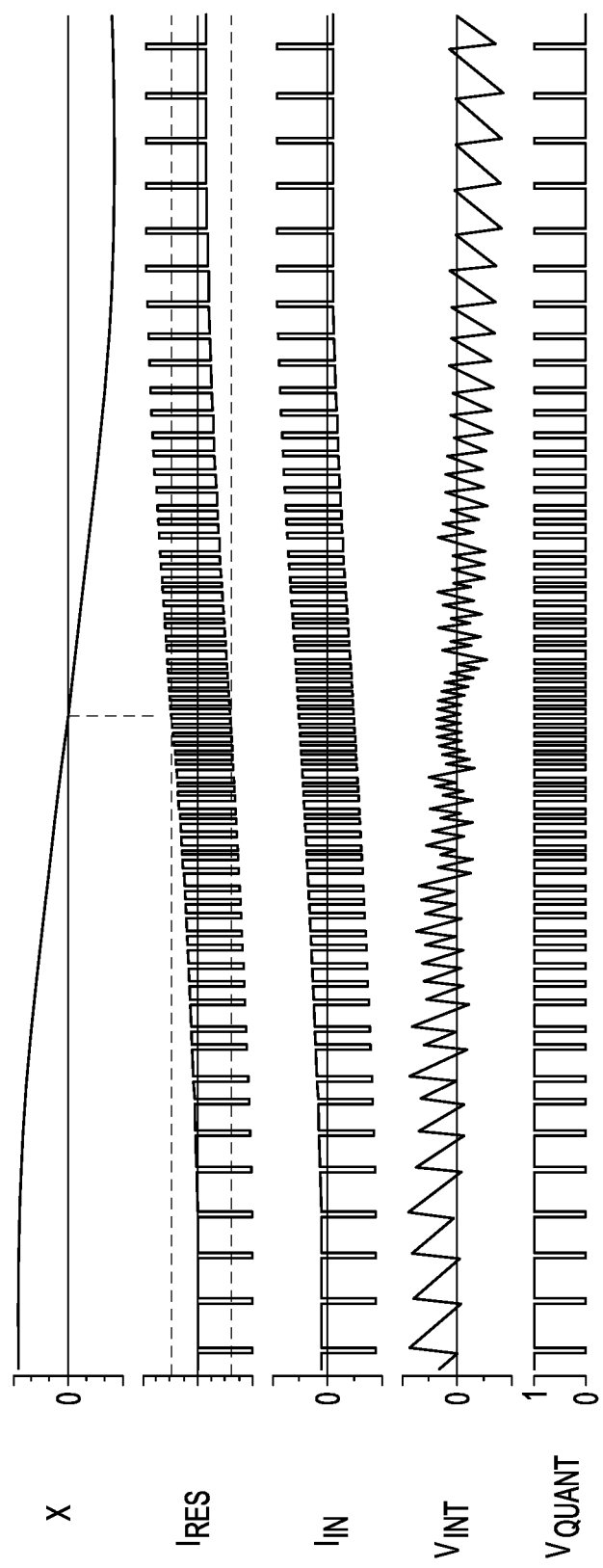
FIG. 3 illustrates waveforms of various signals of the resistive sensor of FIG. 2.

FIG. 3 illustrates waveforms of various signals of the resistive sensor frontend system 40 of FIG. 2. In FIG. 3, the value of x indicates the resistance change due to a changing magnetic field from a high value to a low value. As can be seen, the currents $I_{RES}$ and $I_{IN}$ pulse with the changing output of quantizer 30. The pulse density of VQUANT is related to the value x.

Figure 4:
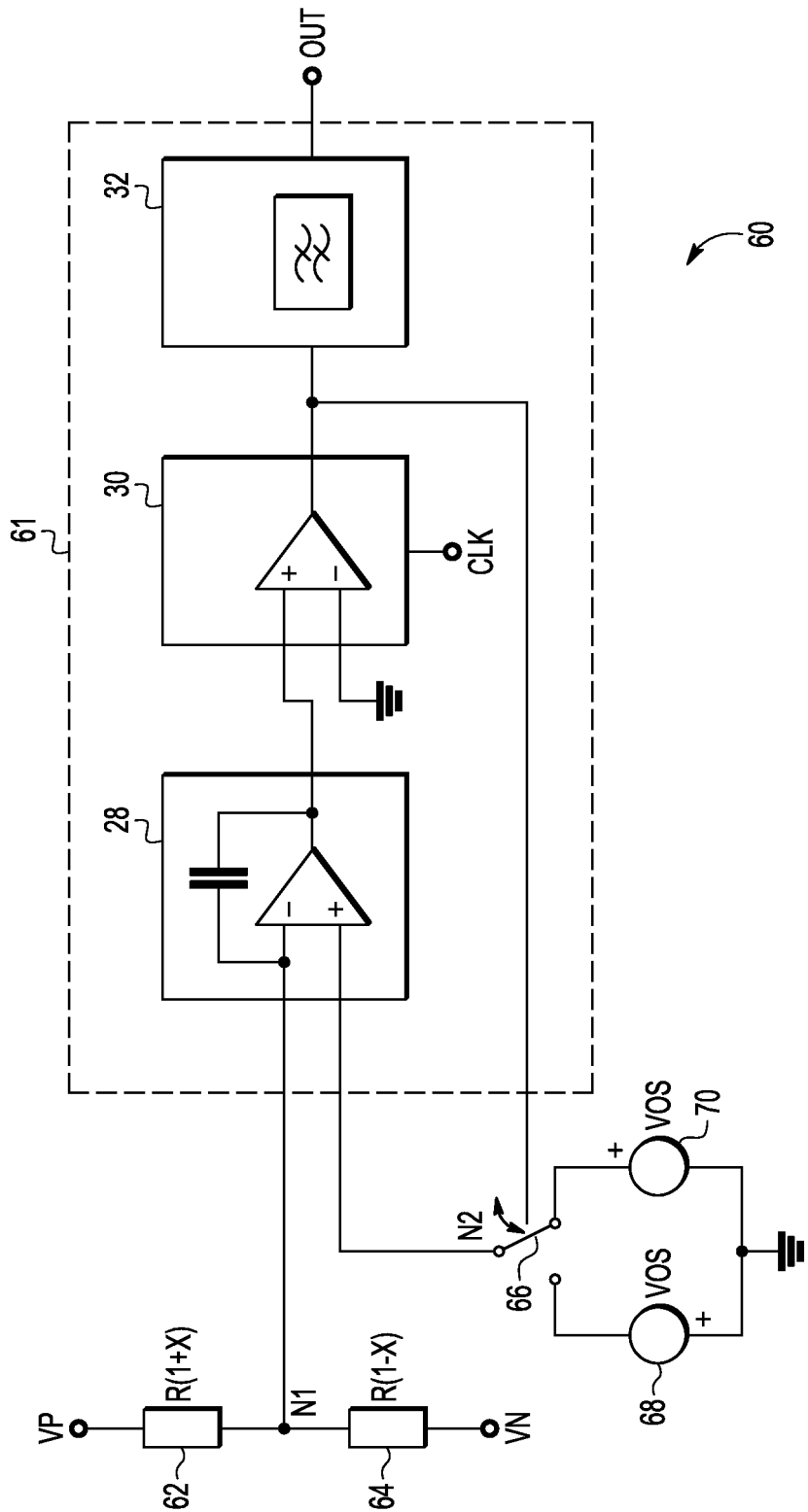
FIG. 4 illustrates a diagram of a resistive sensor frontend system in accordance with another embodiment.

FIG. 4 illustrates a diagram of resistive sensor frontend system 60 in accordance with another embodiment. Resistive sensor frontend system 60 includes a resistor divider comprising resistive sensor elements 62 and 64. A sigma-delta converter portion 61 includes integrator 28, quantizer 30, and decimator 32. Resistive sensor elements 62 and 64 may be AMR sensor elements. Resistive sensor element 62 has a first terminal connected to voltage source VP, and a second terminal connected to node N1. Resistive sensor element 64 has a first terminal connected to node N1, and a second terminal connected to voltage source VN. Resistive sensor element 62 has a first sensitivity direction as indicated in FIG. 4 by R(1+x), and resistive sensor element 64 has a second sensitivity direction different than the first sensitivity direction as indicated in FIG. 4 by R(1−x). Node N1 is connected to a first input terminal of integrator 28. Switch 66 has a first terminal at node N2 and connected to the second input terminal of integrator 28. Offset voltage sources 68 and 70 are connected between switch 66 and ground, wherein offset voltage source 68 is connected with an opposite polarity of offset voltage source 70. Offset voltage sources 68 and 70 are alternately connected to the second input terminal of integrator 28 in response to the feedback signal from the output of quantizer 30 through switch 66.

Integrator 28 differs from the embodiments of FIG. 1 and FIG. 2 because instead of the second input terminal being connected to a reference voltage, such as ground, the offset voltage of resistive sensor 60 connected to the reference input of integrator 28. The equations describing resistive sensor 60 are as follows:

$$\alpha[(V_P+V_{OS})/R(1+x)-(V_N-V_{OS})/R(1-x)]=-(1-\alpha)[(V_P-V_{OS})/R(1+x)-(V_N+V_{OS})/R(1-x)]$$

$$\alpha=(V_N-V_P+2V_{OS}+(V_N+V_P)x)/(4V_{OS})$$

Again assuming that $V_P=V_N=V$ $$\alpha=0.5+[V/(2V_{OS})]x$$

Resistive sensor frontend system 60 therefore also has a linear transfer characteristic for which the gain can be scaled using the offset voltage. One advantage of resistive sensor frontend system 60 is that switches are not needed in the resistive sensor divider comprising resistive sensor elements 62 and 64. Depending on the impedance of resistive sensor elements 62 and 64, these switches might take up significant area and introduce unwanted parasitics.

One drawback of resistive sensor frontend system 60 with respect to resistive sensor frontend system 10 is that the input voltage range of integrator 28 is increased significantly. Some of the benefits of using a current input integrator are therefore compromised.

Mismatch in voltage sources is given by $V_P=(1+\varepsilon)V$ and $V_N=V$, where $\varepsilon$ is the rate of mismatch of the offset voltage $V_{OS}$.

$$\alpha=0.5-\varepsilon V/(4V_{OS})+(2V+\varepsilon V)/(4V_{OS})x, \text{ where } \alpha \text{ is the pulse density.}$$

Mismatch introduces an offset and a change in the slope, but the transfer is still linear. Mismatch in the offset voltages $V_{OSP}=(1+\varepsilon)V_{OS}$ and $V_{OSN}=V_{OS}$ gives:

$$\alpha=1/(2+\varepsilon)+V/(V_{OS}(2+\varepsilon))x$$

As can be seen, the transfer is still linear with resistive sensor frontend system 60. This illustrates another advantage of resistive sensor frontend system 60 compared with resistive sensor frontend system 10, which introduces non-linearity when the offset voltages have mismatch as described above.

Figure 5:
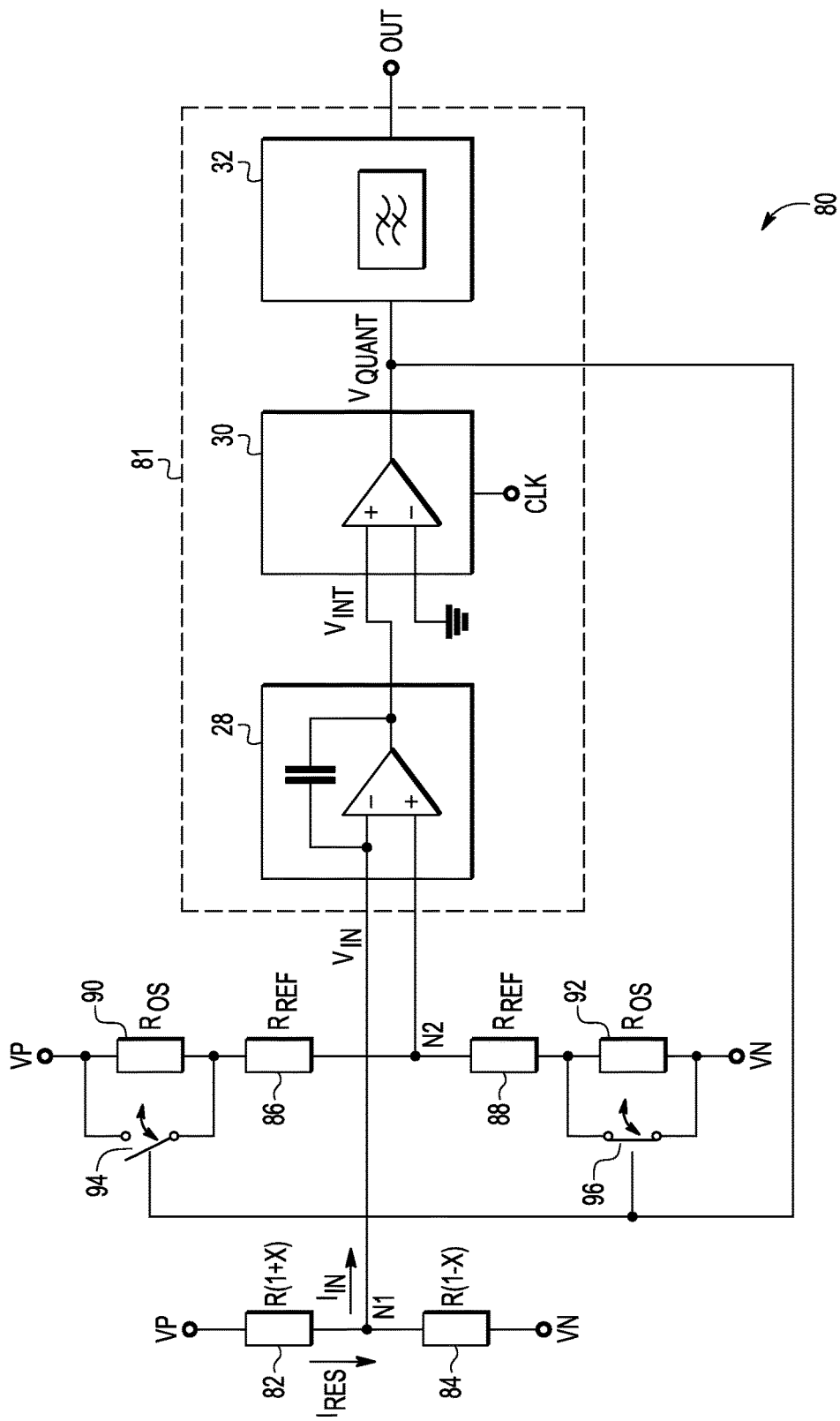
FIG. 5 illustrates a diagram of a resistive sensor frontend system in accordance with an implementation of the resistive sensor of FIG. 4.

FIG. 5 illustrates a diagram of resistive sensor frontend system 80 in accordance with an implementation of resistive sensor frontend system 60 of FIG. 4. Resistive sensor 80 includes a resistive sensor divider coupled between voltage sources VP and VN, and comprising resistive sensor elements 82 and 84. A sigma-delta converter portion 81 includes integrator 28, quantizer 30, and decimator 32. Resistive sensor element 82 has a first sensitivity direction given by R(1+x) and resistive sensor element 84 has a second sensitivity direction, opposite the first sensitivity direction given by R(1−x). Resistive sensor elements 82 and 84 are connected together to provide a current $I_{IN}$ at node N1 and node N1 is connected to the first input terminal of integrator 28. In one embodiment, resistive sensor elements 82 and 84 are AMR sensors. An offset voltage is provided to the second input terminal of integrator 28 by the series connection of reference resistors 86 and 88, and offset voltage resistors 90 and 96 at node N2. Resistors 86 and 88 are conventional resistors and are connected to form a voltage divider with the offset resistors 90 and 96, also conventional resistors, connected between the divider and the voltage sources VP and VN. Switch 94 is connected in parallel across offset voltage resistor 90, and switch 96 is connected in parallel across offset voltage resistor 96. Switches 94 and 96 are controlled by the feedback voltage from the output of quantizer 30. When the quantizer voltage VQUANT is a logic high, switch 94 is open and switch 96 is closed as illustrated. The magnetic field strength causes the value x to change, which changes the resistance of resistive sensor elements 82 and 84. The changing resistance of resistive sensor elements 82 and 84 changes the input current of integrator 28 and works similarly to the resistive sensor frontend system 10 in FIG. 1.

Figure 6:
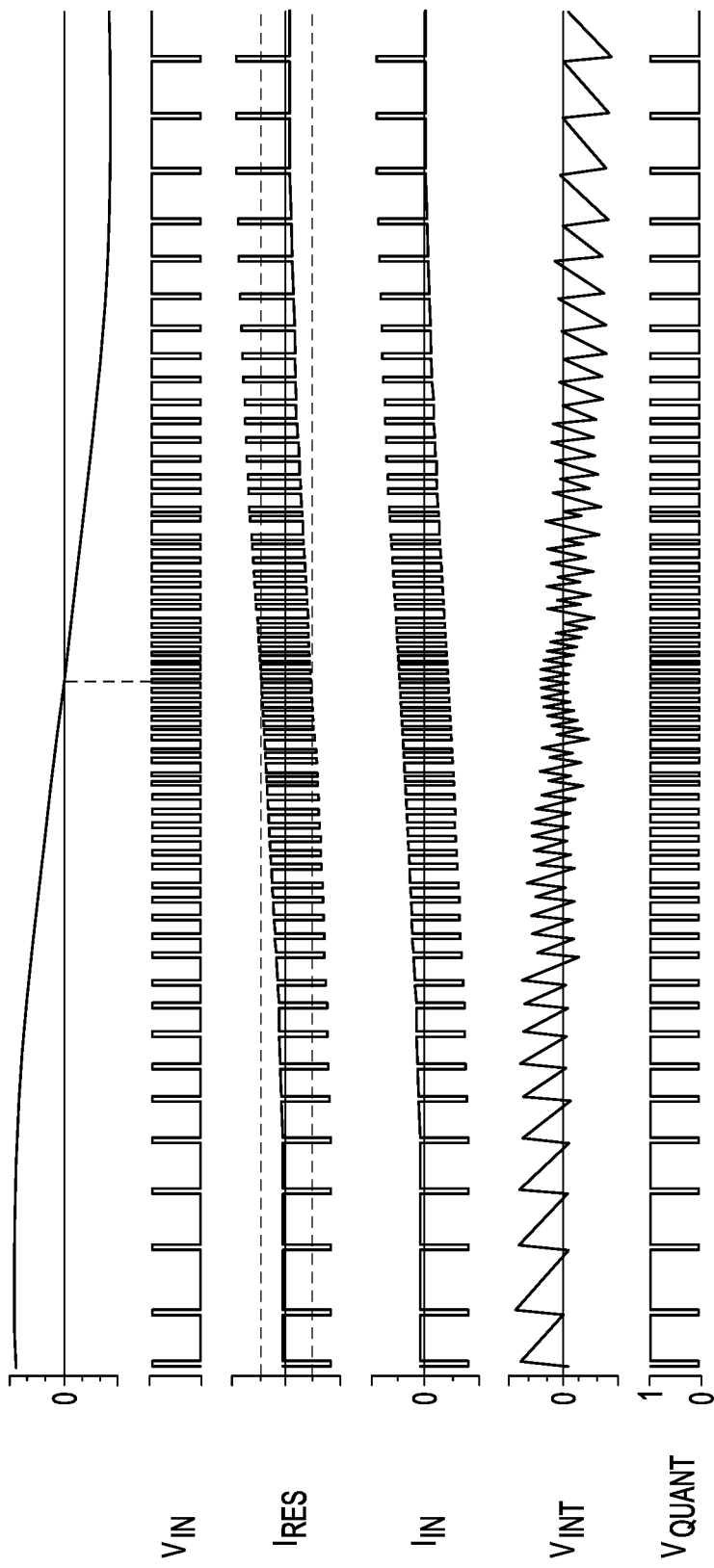
FIG. 6 illustrates waveforms of various signals of the resistive sensor of FIG. 5.

FIG. 6 illustrates waveforms of various signals of the resistive sensor frontend system 80 of FIG. 5. In FIG. 6, the value of x indicates the relative resistance change of the sensor elements due to a changing magnetic field from a high value to a low value. As can be seen, the currents $I_{RES}$ and $I_{IN}$ pulse with the changing output of quantizer 30. The pulse density of VQUANT is related to the value x.

Figure 7:
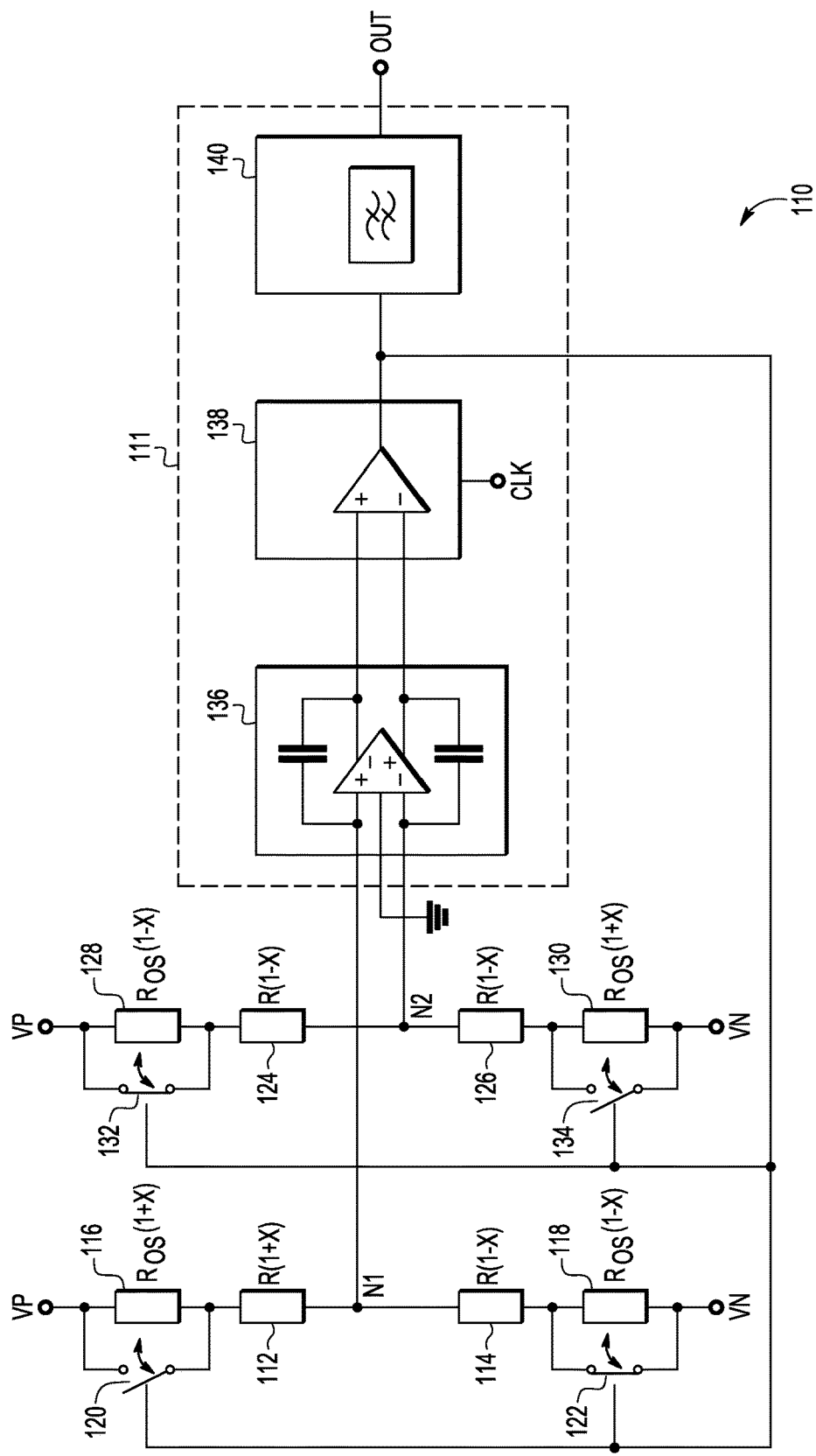
FIG. 7 illustrates a diagram of a resistive sensor frontend system in accordance with another embodiment.

FIG. 7 illustrates a diagram of resistive sensor frontend system 110 in accordance with a modification of resistive sensor frontend system 40 of FIG. 2. Resistive sensor frontend system 110 is a fully differential implementation of resistive sensor 40. Generally, resistive sensor 110 includes two voltage dividers, each connected to an input of integrator 136. A sigma-delta converter portion 111 includes integrator 136, quantizer 138, and decimator 140.

Offset voltage sources are connected to each voltage divider. More specifically, resistive sensor 110 includes resistive sensor elements 112, 114, 124, and 126, offset sensor elements 116, 118, 128, and 130, switches 120, 122, 132, and 134, integrator 136, quantizer 138, and decimator 140. An offset voltage source is provided by the parallel connection of switch 120 with resistive sensor element 116, switch 122 with resistive sensor element 118, switch 132 with resistive sensor element 128, and switch 134 with resistive sensor element 130. The feedback signal from the output of quantizer 138 controls each of switches 120, 122, 132, and 134. When the feedback signal is a logic low, switches 122 and 132 are closed, and switches 120 and 134 are open. In one embodiment, each of resistor elements 112, 114, 124, 126, 116, 118, 128, and 130 are AMR resistors.

Figure 8:
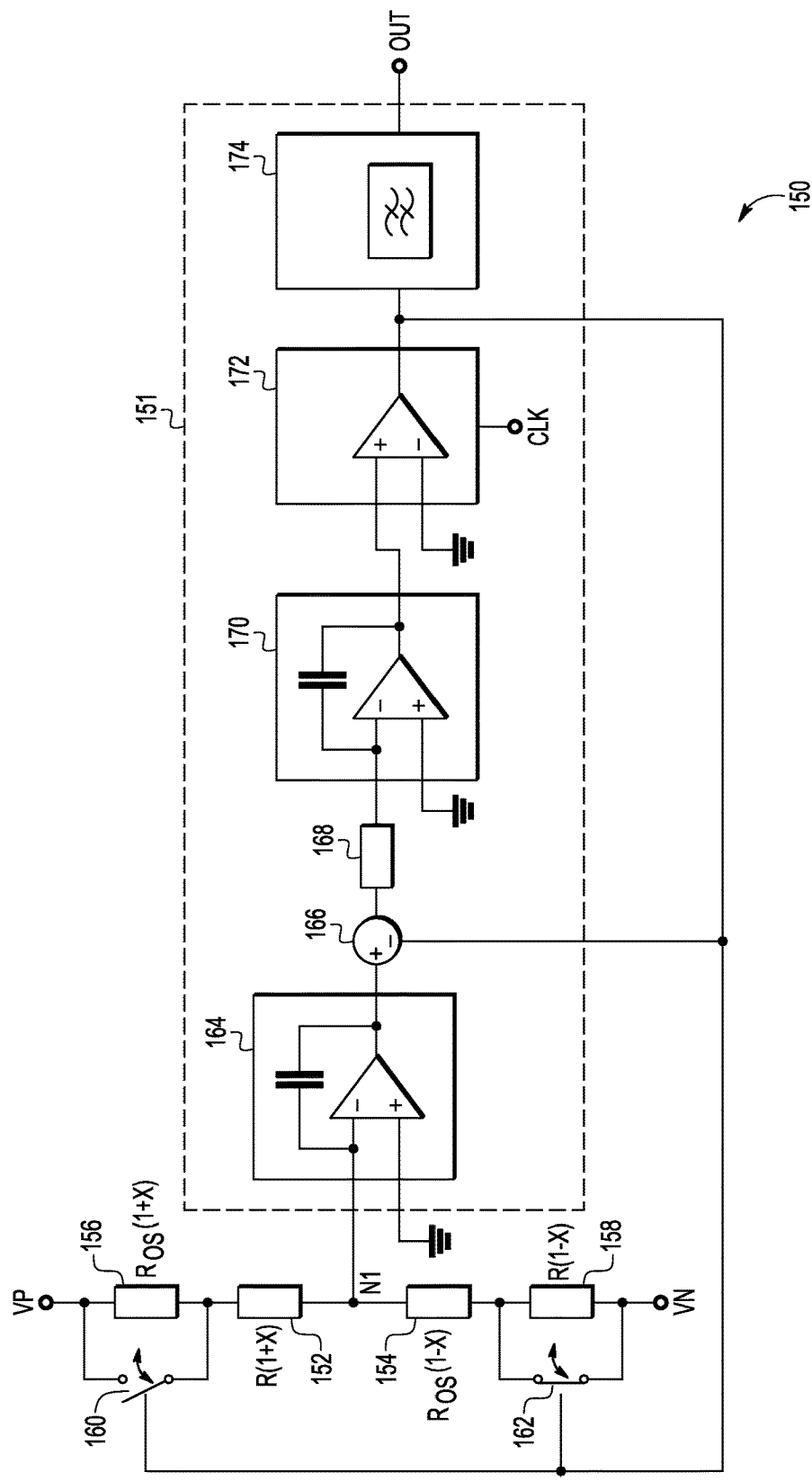
FIG. 8 illustrates a diagram of a resistive sensor in accordance with another embodiment.

FIG. 8 illustrates a diagram of a resistive sensor frontend system 150 in accordance with another embodiment. Resistive sensor frontend system 150 is a second order implementation of resistive sensor 40 of FIG. 2. Resistive sensor 150 frontend system includes a voltage divider comprising resistive sensor elements 152 and 154 connected to a node N1. A sigma-delta converter portion 151 includes integrator 164, integrator 170, quantizer 172, and decimator 174. Offset voltage sources comprising offset resistive elements 156 and 158 and switches 160 and 162, respectively, are series connected between the voltage divider and voltage sources VP and VN. Node N1 is connected to a first input terminal of integrator 164. A second input terminal of integrator 164 is connected to ground. A summation element 166 has a first input connected to the output of integrator 164, a second input for receiving a feedback signal, and an output connected to a a first terminal of a resistor 168. Resistor 168 has a second terminal connected to a first input terminal of integrator 170. Integrator 170 has a second input connected to ground, and an output connected to an input of quantizer 172. Quantizer 172 has an output for providing the feedback signal to the second input of mixer 166 and switches 160 and 162. When the output of quantizer 172 is a logic high, switch 160 is open and switch 162 is closed, as illustrated in FIG. 8. An output of quantizer 172 is also connected to an input of decimator 174. An output of decimator 174 provides output signal OUT.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A resistive sensor frontend system comprising:
   a first resistive element having a first terminal coupled to receive a first voltage source, and a second terminal;
   a second resistive element having a first terminal coupled to the second terminal of the first resistive element, and a second terminal at a first node;
   a third resistive element having a first terminal coupled to the second terminal of the second resistive element at the first node, and a second terminal;
   a fourth resistive element having a first terminal coupled to the second terminal of the third resistive element, and a second terminal coupled to receive a second voltage source;
   a first switch having a first terminal coupled to the first terminal of the first resistive element, a second terminal coupled to the second terminal of the first resistive element, and a control terminal;
   a second switch having a first terminal coupled to the first terminal of the fourth resistive element, and a second terminal coupled to the second terminal of the fourth resistive element, and a control terminal;
   an integrator having a first input terminal coupled to the first node, and an output terminal;
   a quantizer having a first input terminal coupled to the output terminal of the integrator, a second input terminal for receiving a clock signal, and an output terminal coupled to provide a feedback signal to the control terminals of the first and second switches; and
   a decimator having an input terminal coupled to the output terminal of the quantizer, and an output terminal for providing an output signal.

2. The resistive sensor frontend system of claim 1, wherein each of the first, second, third, and fourth resistive elements is a magnetic sensor that provides a changing resistance in response to a changing magnetic field.

3. The resistive sensor frontend system of claim 1, wherein the second resistive element is a magnetic sensor having a first sensitivity direction, and the third resistive element is a magnetic sensor having a second sensitivity direction.

4. The resistive sensor frontend system of claim 1, further comprising:
a fifth resistive element having a first terminal coupled to receive the first voltage source, and a second terminal;
a sixth resistive element having a first terminal coupled to the second terminal of the fifth resistive element, and a second terminal at a second node;
a seventh resistive element having a first terminal coupled to the second terminal of the sixth resistive element at the second node, and a second terminal;
an eighth resistive element having a first terminal coupled to the second terminal of the seventh resistive element, and a second terminal coupled to receive the second voltage source;
a third switch having a first terminal coupled to the first terminal of the fifth resistive element, a second terminal coupled to the second terminal of the fifth resistive element, a control terminal coupled to the output terminal of the quantizer; and
a fourth switch having a first terminal coupled to the first terminal of the eighth resistive element, and a second terminal coupled to the second terminal of the eighth resistive element, and a control terminal coupled to the output terminal of the quantizer.

5. The resistive sensor frontend system of claim 1, wherein the first voltage source is a positive voltage and the second voltage source is a negative voltage.

6. The resistive sensor frontend system of claim 4, wherein each of the fifth, sixth, seventh, and eighth resistive elements is a magnetic sensor that provides a changing resistance in response to a changing magnetic field.

7. The resistive sensor frontend system of claim 4, wherein the sixth resistive element is a magnetic sensor having a first sensitivity direction, and the seventh resistive element is a magnetic sensor having a second sensitivity direction.

8. A resistive sensor frontend system comprising:
a first resistive divider comprising first and second resistive sensor elements of opposite sensitivity directions, the first resistive divider coupled between first and second voltage sources, the first and second resistive sensor elements coupled together at a first node;
an offset voltage source coupled to the first resistive divider to provide an offset voltage to the first resistive divider in response to a feedback signal;
an integrator having a first input terminal coupled to the first node, and an output terminal;
a quantizer having a first input terminal coupled to the output terminal of the integrator, a second input terminal for receiving a clock signal, and an output terminal coupled to provide the feedback signal; and
a decimator having an input terminal coupled to the output terminal of the quantizer, and an output terminal for providing an output signal.

9. The resistive sensor frontend system of claim 8, wherein the offset voltage source further comprises:
a first switched offset voltage circuit coupled between the first resistive sensor element and the first voltage source; and
a second switched offset voltage circuit coupled between the second resistive sensor element and the second voltage source,
wherein the first and second switched offset voltage circuits are alternately switched in response to the feedback signal.

10. The resistive sensor front end system frontend system of claim 9, wherein each of the first and second switched offset voltage circuits further comprising a resistive element in parallel with a switch, the feedback signal from the output terminal of the quantizer being used to control the switch.

11. The resistive sensor frontend system of claim 8, wherein each of the first and second resistive sensor elements is a magnetic sensor that provides a changing resistance in response to a changing magnetic field.

12. The resistive sensor frontend system of claim 8, wherein the-first resistive sensor element is a magnetic sensor having a first sensitivity direction, and the second resistive element is a magnetic sensor having a second sensitivity direction.

13. The resistive sensor frontend system of claim 8, wherein the first source voltage is a positive voltage and the second source voltage is a negative voltage.

14. The resistive sensor frontend system of claim 8, wherein the first and second resistive sensor elements are anisotropic magnetoresistance sensors.

15. The resistive sensor frontend system of claim 8, wherein the resistive sensor frontend is implemented on a single integrated circuit.

16. A resistive sensor frontend system comprising:
a resistive sensor circuit having an input coupled to receive a voltage source, and the resistive sensor circuit having an output;
an offset voltage source coupled to receive the voltage source, and to provide an offset voltage to the resistive sensor circuit in response to a feedback signal;
an integrator having a first input terminal coupled to the output of the resistive sensor circuit, and an output terminal;
a quantizer having a first input terminal coupled to the output terminal of the integrator, a second input terminal for receiving a clock signal, and an output terminal coupled to provide the feedback signal; and
a decimator having an input terminal coupled to the output terminal of the quantizer, and an output terminal for providing an output signal.

\* \* \* \* \*